(12) United States Patent
Toshimori et al.

(10) Patent No.: US 10,577,687 B2
(45) Date of Patent: Mar. 3, 2020

(54) AG ALLOY SPUTTERING TARGET AND AG ALLOY FILM MANUFACTURING METHOD

(71) Applicant: MITSUBISHI MATERIALS CORPORATION, Tokyo (JP)

(72) Inventors: Yuto Toshimori, Sanda (JP); Shozo Komiyama, Sanda (JP); Ichiro Shiono, Sanda (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 15/313,127

(22) PCT Filed: Feb. 18, 2016

(86) PCT No.: PCT/JP2016/054727
§ 371 (c)(1),
(2) Date: Nov. 22, 2016

(87) PCT Pub. No.: WO2016/136590
PCT Pub. Date: Sep. 1, 2016

(65) Prior Publication Data
US 2017/0191154 A1  Jul. 6, 2017

(30) Foreign Application Priority Data

Feb. 27, 2015  (JP) ................. 2015-037949
Feb. 2, 2016  (JP) ................. 2016-017804

(51) Int. Cl.
*C23C 14/34* (2006.01)
*C23C 14/14* (2006.01)
(Continued)

(52) U.S. Cl.
CPC ............ *C23C 14/3414* (2013.01); *C22C 5/06* (2013.01); *C22C 5/08* (2013.01); *C23C 14/14* (2013.01);
(Continued)

(58) Field of Classification Search
CPC ......... C23C 14/3414; C22C 5/06; C22C 5/08; C22C 14/14; C22C 14/34; C22C 14/35; H01J 37/3429
See application file for complete search history.

(56) References Cited

U.S. PATENT DOCUMENTS 6,514,628 B1 * 2/2003 Ueno ................. F21S 48/1394
362/296.02
2004/0253137 A1  12/2004 Gehlert et al.
2015/0041313 A1  2/2015 Komiyama

FOREIGN PATENT DOCUMENTS

CN  1446941 A  10/2003
CN  104093865 A  10/2014
(Continued)

OTHER PUBLICATIONS

Translation to Takahashi (JP 2000-239836) dated Sep. 2000.*
(Continued)

*Primary Examiner* — John J Brayton
(74) *Attorney, Agent, or Firm* — Locke Lord LLP

(57) ABSTRACT

A sputtering target, which has a composition comprising: one or more elements selected from Cu, Sn, Sb, Mg, In, and Ti in a range of 0.1 atomic % or more and 15.0 atomic % or less in total; S in a range of 0.5 atomic ppm or more and 200 atomic ppm or less; and a Ag balance including inevitable impurities, is provided.

7 Claims, 1 Drawing Sheet

(51) Int. Cl.
 *C22C 5/06* (2006.01)
 *C22C 5/08* (2006.01)
 *H01J 37/34* (2006.01)
 *C23C 14/35* (2006.01)

(52) U.S. Cl.
 CPC .............. *C23C 14/34* (2013.01); *C23C 14/35* (2013.01); *H01J 37/3429* (2013.01)

(56) References Cited

FOREIGN PATENT DOCUMENTS

| | | | | |
|---|---|---|---|---|
| EP | 2045630 | A1 | | 4/2009 |
| EP | 2045631 | A1 | | 4/2009 |
| EP | 2937444 | A1 | | 10/2015 |
| JP | H1060632 | A | | 3/1998 |
| JP | 2000239836 | A | * | 9/2000 |
| JP | 2001-221908 | A | | 8/2001 |
| JP | 2001-357559 | A | | 12/2001 |
| JP | 2003160859 | A | * | 6/2003 |
| JP | 2005-008983 | A | | 1/2005 |
| JP | 2013-204052 | A | | 10/2013 |
| JP | 2014-074225 | A | | 4/2014 |
| JP | 2014-159628 | A | | 9/2014 |
| JP | 2014159628 | A | * | 9/2014 ............... C22C 5/06 |
| JP | 2014-196562 | A | | 10/2014 |
| KR | 20140043905 | A | | 4/2014 |
| KR | 10-2014-0134723 | A | | 11/2014 |
| TW | 201439339 | A | | 10/2014 |
| TW | 201444987 | A | | 12/2014 |
| WO | 2012176407 | A1 | | 12/2012 |

OTHER PUBLICATIONS

Translation to Toshiimori (JP 2014-159628) dated Sep. 2014.*
Translation to Mori (JP 2003-160859) published Jun. 2003. (Year: 2003).*
International Search Report dated Apr. 12, 2016, issued for PCT/JP2016/054727 and English translation thereof.
Office Action dated May 3, 2017, issued for the Chinese Patent Application No. 201680001534.3 and partial English translation of Search Report.
Office Action dated Mar. 1, 2017, issued for the Korean patent application No. 10-2016-7033233 and English translation thereof.
Notice of Allowance dated Jan. 18, 2017, issued for the Taiwanese patent application No. 105105473 and English translation thereof.
The extended European search report dated Mar. 14, 2018 issued for corresponding European Patent Application No. 16755337.9.
Office Action dated on May 1, 2018 issued for corresponding Korean Patent Application No. 10-2016-7033233.
Decision for Grant of Patent dated Oct. 17, 2018 issued for corresponding Korean Patent Application No. 10-2016-7033233.

* cited by examiner

AG ALLOY SPUTTERING TARGET AND AG ALLOY FILM MANUFACTURING METHOD

TECHNICAL FIELD

The present invention relates to a Ag alloy sputtering target and a method of producing a Ag alloy film for forming a Ag alloy film, which is applicable to the reflective electrode film for displays, LED, and the like; the wiring film and the transparent conductive film of the touch panels; and the like, for example.

Priority is claimed on Japanese Patent Application No. 2015-037949, filed Feb. 27, 2015 and Japanese Patent Application No. 2016-017804, filed Feb. 2, 2016, the contents of which are incorporated herein by reference.

BACKGROUND ART

Patterned conductive films (wiring films) are formed in electronic devices such as the touch panel, the solar cell, the organic EL element, and the like. As these conductive films (wiring films), the Ag film and the Ag alloy film having a low resistance value are widely used.

However, there is a problem that optical and electric properties of Ag and Ag alloy are likely to be deteriorated because of environmental temperature and humidity during the production process and usage; contamination of Cl; or the like.

Accordingly, a Ag alloy sputtering target, which makes it possible to deposit a Ag alloy film with improved environmental resistance, is proposed in Patent Literature 1 (PTL 1).

In PTL 1, improvement of environmental resistance is attempted by adding Sb and Mg in appropriate amounts.

CITATION LIST

Patent Literature

[PTL 1] Japanese Unexamined Patent Application, First Publication No. 2014-159628(A)

SUMMARY OF INVENTION

Technical Problem

Recently, miniaturization of electrode and wiring patterns is further promoted in displays, LEDs, touch panels, organic EL elements, and the like. However, in these miniaturized electrode and wiring patterns, short-circuiting could occur during electrical power application because the so-called ion-migration is likely to occur in Ag. Therefore, a Ag alloy film that is highly resistance to ion migration is in demand.

The present invention is made under the circumstance explained above. The purpose of the present invention is to provide a Ag alloy sputtering target, which makes it possible to deposit a Ag alloy film having excellent environmental resistance (heat-moisture resistance) and ion migration resistance, and a method of producing the Ag alloy film by using the Ag alloy sputtering target.

Solution to Problem

In order to solve the above-mentioned problem, a Ag alloy sputtering target, which is an aspect of the present invention, has a composition including: one or more elements selected from Cu, Sn, Sb, Mg, In, and Ti in a range of 0.1 atomic % or more and 15.0 atomic % or less in total; S in a range of 0.5 atomic ppm or more and 200 atomic ppm or less; and a Ag balance including inevitable impurities (hereinafter, referred as "the Ag alloy sputtering target of the present invention").

Since the Ag alloy sputtering target of the present invention includes one or more elements selected from Cu, Sn, Sb, Mg, In, and Ti in a range of 0.1 atomic % or more and 15.0 atomic % or less in total, wettability of the deposited Ag alloy film is improved; and agglomeration of films is suppressed. Because of this, stability of properties under a hot-humid condition and ion migration resistance can be improved at the same time.

In addition, since the Ag alloy sputtering target of the present invention includes S in a range of 0.5 atomic ppm or more and 200 atomic ppm or less, silver sulfide is formed on the surface of the deposited Ag alloy film; and the ion migration resistance can be further improved.

The Ag alloy sputtering target of the present invention may include two or more elements selected from Cu, Ti, and Sn in a range of 1.0 atomic % or more and 10.0 atomic % or less in total.

In this case, the wettability of the deposited Ag alloy film can further improved; and agglomeration of the films can be suppressed, since it includes two or more elements selected from Cu, Ti, and Sn. Because of this, the ion migration resistance can be improved, while the electrical conductivity of the Ag alloy film is retained at a high level.

In addition, the Ag alloy sputtering target may include one or more of metal elements having a standard electrode potential higher than Ag at 0.1 atomic % or more in total, a grand total of a content of the metal elements and a total content of Cu, Sn, Sb, Mg, In, and Ti being 15.0 atomic % or less.

In this case, the standard electrode potential of the alloyed Ag is increased by adding a metal element having a high standard electrode potential to the Ag. Then, by suppressing ionization of Ag, the Ag alloy film having a further improved ion migration resistance can be deposited.

In addition, in the sputtering target of the present invention, among the inevitable impurities, a total content of Y, Nd, Ni, Mo, W, Zn, Ga, Al, Fe, and Co may be 100 ppm by mass or less.

In this case, since the total content of Y, Nd, Ni, Mo, W, Zn, Ga, Al, Fe, and Co, each of which is an element forms sulfide with low free energy, is 100 ppm by mass or less, consumption of S (sulfur) due to the reaction with these elements is suppressed; and silver sulfide can be formed reliably on the surface of the deposited Ag alloy film. As a result, the Ag alloy film with reliably improved ion migration resistance can be deposited. In addition, occurrence of abnormal electrical discharge and splashing during sputtering due to sulfides of the above-described elements can be suppressed.

In addition, in the sputtering target of the present invention, among the inevitable impurities, a total content of Na, Si, V, and Cr may be 100 ppm by mass or less.

In this case, since the total content of Na, Si, V, and Cr, each of which is an element with low solid solubility against Ag, is 100 ppm by mass or less, incrassating of these elements in grain boundaries or the like and formation of compounds thereof are suppressed; and occurrence of abnormal electrical discharge during sputtering can be suppressed reliably.

Another aspect of the present invention is a method of producing a Ag alloy film including a step of depositing a film by the above-described Ag alloy sputtering target (hereinafter, referred as "the method of producing a Ag alloy film of the present invention").

According to the method of producing a Ag alloy film of the present invention with the above-described configuration, agglomeration of films is suppressed; and heat-moisture resistance and ion migration resistance are improved, since the obtained Ag alloy film includes one or more elements selected from Cu, Sn, Sb, Mg, In, and Ti. In addition, because silver sulfide is formed on the surface of the Ag alloy film, it becomes possible to improve the ion migration resistance significantly.

Advantageous Effects of Invention

According to the present invention, a Ag alloy sputtering target, which makes it possible to deposit a Ag alloy film having excellent environmental resistance (heat-moisture resistance) and ion migration resistance, and a method of producing a Ag alloy film using the Ag alloy sputtering target can be provided.

DESCRIPTION OF EMBODIMENTS

Figure 1A:
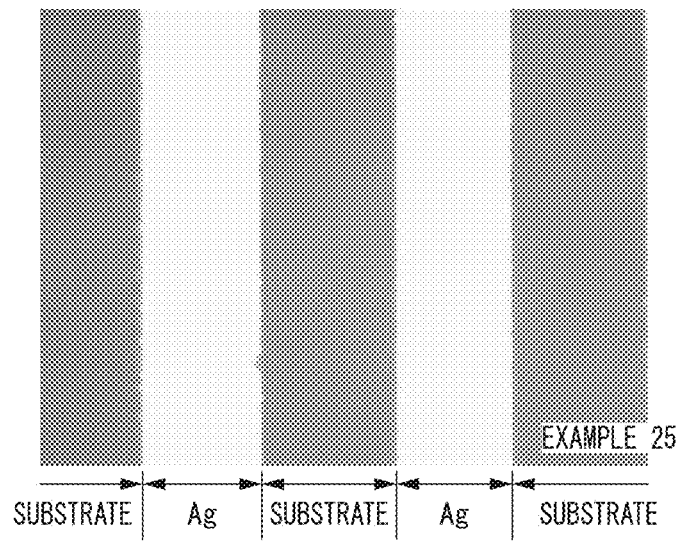
FIG. 1A is a figure showing an example of results of ion migration evaluation in one of Examples corresponding to Example 25 of the present invention. Regions corresponding to three substrates in the grey color; and regions corresponding to two Ag alloy films in the white color, are shown in the figure.

A Ag alloy sputtering target and a method of producing a Ag alloy film, each which is an embodiment of the present invention, are explained below.

The Ag alloy sputtering target, which is an embodiment of the present invention, is used during depositing a Ag alloy film. The Ag alloy film obtained by the method of producing a Ag alloy film, which is an embodiment of the present invention, is used as conductive films and wiring films of electronic devices, such as touch panels, solar cells, organic EL element, and the like.

[Ag Alloy Sputtering Target]

The Ag alloy sputtering target of the present embodiment has a composition including: one or more elements selected from Cu, Sn, Sb, Mg, In, and Ti in a range of 0.1 atomic % or more and 15.0 atomic % or less in total; S in a range of 0.5 atomic ppm or more and 200 atomic ppm or less; and a Ag balance including inevitable impurities. Alternatively, it has a composition including one or more of metal elements having a standard electrode potential higher than Ag at 0.1 atomic % or more in total, a grand total of a content of the metal elements and a total content of Cu, Sn, Sb, Mg, In, and Ti being 15.0 atomic % or less in addition to the above-described composition. In addition, S (sulfur) is dispersed in the target as silver sulfide ($Ag_2S$). In addition, in the Ag alloy sputtering target, the average crystal grain size of silver is set in the range of 20 μm or more and 200 μm or less.

In the present embodiment, among the inevitable impurities, the total content of Y, Nd, Ni, Mo, W, Zn, Ga, Al, Fe, and Co is 100 ppm by mass or less.

In addition, in the present embodiment, among the inevitable impurities, the total content of Na, Si, V, and Cr is 100 ppm by mass or less.

Reasons for defining the composition of the Ag alloy sputtering target of the present embodiment as described above are explained below.

[Total Content of Cu, Sn, Sb, Mg, In, and Ti: 0.1 Atomic % or More and 15.0 Atomic % or Less]

The above-described elements such as Cu, Sn, Sb, Mg, In, and Ti have a pinning effect to silver atoms in the deposited Ag alloy film; and a function effect suppressing agglomeration and migration of films due to heat and an electrochemical reaction. Because of this, heat-moisture resistance and ion migration resistance of the Ag alloy film are improved.

If the total content of one or more elements selected from Cu, Sn, Sb, Mg, In, and Ti were less than 0.1 atomic %, it would be possible that the above-described function effect could not be obtained. On the other hand, if the total content of one or more of Cu, Sn, Sb, Mg, In, and Ti exceeded 15.0 atomic %, resistance in the deposited Ag alloy film would be increased; and it would be possible that the electrical conductivity could be reduced.

Because of the reasons described above, the total content of one or more elements selected from Cu, Sn, Sb, Mg, In, and Ti in the Ag alloy sputtering target is set in the range of 0.1 atomic % or more and 15.0 atomic % or less in the present embodiment.

In addition, in order to improve the heat-moisture resistance and the ion migration resistance reliably by suppressing agglomeration of films, it is preferable that the lower limit of the total content of one or more elements selected from Cu, Sn, Sb, Mg, In, and Ti is set to 0.2 atomic % or more. More preferably, the lower limit is set to 1.0 atomic % or more.

In addition, in order to retain an acceptable electrical conductivity of the deposited Ag alloy film reliably, it is preferable that the upper limit of the total content of one or more elements selected from Cu, Sn, Sb, Mg, In, and Ti is set to 10.0 atomic % or less. More preferably, it is set to 5.0 atomic % or less.

In addition, in order to retain an electrical conductivity of the deposited Ag alloy film at a high level reliably, it is preferable that the total content of 2 or more elements selected from Cu, Ti, and Sn is set to 1.0 atomic % or more and 10.0 atomic % or less.

[S: 0.5 Atomic ppm or More and 200 Atomic ppm or Less]

S (sulfur) has a function effect of improving the ion migration resistance significantly by being enriched on the surface of the deposited Ag alloy film; and by forming a thin silver sulfide film on the outermost surface of the Ag alloy film.

If the S content were less than 0.5 atomic ppm, it would be possible that the above-described function effect could not be obtained. On the other hand, if the S content exceeded 200 atomic ppm, it would be possible that optical and electrical properties of the Ag alloy film could be deteriorated. In addition, it would be possible that the abnormal electrical discharge could likely to occur during sputtering due to silver sulfide existing beyond necessity in the target.

Because of the reasons described above, the S content in the Ag alloy sputtering target is set to the range of 0.5 atomic ppm or more and 200 atomic ppm or less in the present embodiment.

In order to improve the ion migration resistance reliably by forming the silver sulfide film on the outermost surface of the Ag alloy film reliably, it is preferable that the lower limit of the S content is 1 atomic ppm or more. More preferably, the lower limit of S content is 5 atomic ppm or more.

In addition, in order to suppress the deterioration of optical and electrical properties of the Ag alloy film reliably; and to suppress the occurrence of the abnormal electrical discharge, it is preferable that the upper limit of the S content is 100 atomic ppm or less. More preferably, the upper limit of the S content is 50 atomic ppm or less.

[Total Amount of Metal Elements Having a Standard Electrode Potential Higher than Ag: 0.1 Atomic % or More and 15.0 Atomic % or Less as the Grand Total of the Content of the Metal Elements and the Total Content of Cu, Sn, Sb, Mg, In, and Ti]

The above-described metal elements having a standard electrode potential higher than Ag (Pd, Pt, and Au) have effect increasing the standard electrode potential of the Ag alloy by alloying with Ag. Because of this, the ion migration can be further improved due to suppression of Ag ionization. Furthermore, the electrochemical corrosion reaction to Ag by Cl can be suppressed because of the effect suppressing Ag ionization.

If the total content of metal elements having a standard electrode potential higher than Ag were less than 0.1 atomic %, it would be possible that the above-described function effect could not be obtained. On the other hand, if the grand total of the content of the metal elements, which have a standard electrode potential higher than Ag, and the total content of Cu, Sn, Sb, Mg, In, and Ti exceeded 15.0 atomic %, resistance of the deposited Ag alloy film could be increased; and the electrical conductivity could be reduced.

Because of the reasons described above, the total content of one or more of metal elements having a standard electrode potential higher than Ag is set to 0.1 atomic % or more; and the grand total of the content of the metal elements and the total content of Cu, Sn, Sb, Mg, In, and Ti is set to 15.0 atomic % or less in the Ag alloy sputtering target of the present embodiment.

In order to further improve the ion migration resistance by raising the standard electrode potential of the Ag alloy, it is preferable that the lower limit of the total content of the metal elements having a standard electrode potential higher than Ag is set to 0.5 atomic % or more. More preferably, the lower limit is set to 1.0 atomic % or more.

In addition, in order to retain an acceptable electrical conductivity of the deposited Ag alloy film reliably, it is preferable that the upper limit of the grand total of the content of the metal elements, which have a standard electrode potential higher than Ag, and the total content of Cu, Sn, Sb, Mg, In, and Ti is set to 10.0 atomic % or less. More preferably, the upper limit is set to 5.0 atomic % or less.

[Total Content of Y, Nd, Ni, Mo, W, Zn, Ga, Al, Fe, and Co: 100 ppm by Mass or Less]

Among the inevitable impurities, elements such as Y, Nd, Ni, Mo, W, Zn, Ga, Al, Fe, and Co need low free energy for sulfide formation. Thus, they are likely to form sulfides by reacting with S (sulfur). Because of this, S (sulfur) is consumed; and formation of the silver sulfide film on the outermost surface of the Ag alloy film is suppressed. Accordingly, it is possible that the ion migration resistance could not be improved sufficiently.

Because of the reasons described above, among the inevitable impurities, the total content of Y, Nd, Ni, Mo, W, Zn, Ga, Al, Fe, and Co is set to 100 ppm by mass or less in the Ag alloy sputtering target of the present embodiment.

In order to suppress formation of sulfides of these elements; and to improve the ion migration resistance by forming the silver sulfide film reliably, it is preferable that the total content of Y, Nd, Ni, Mo, W, Zn, Ga, Al, Fe, and Co is set to 50 ppm by mass or less. More preferably, it is set to 10 ppm by mass or less.

[Total Content of Na, Si, V. and Cr: 100 ppm by Mass or Less]

Among the inevitable impurities, elements such as Na, Si, V, and Cr have low solid solubility against Ag. Thus, they are segregated in crystal boundaries of the Ag alloy sputtering target; and oxides are formed after reacting with oxygen, for example. Due to the presence of the oxides segregated in the Ag alloy sputtering target, it is possible that abnormal electrical discharge and splashing could occur during sputtering. In addition, elements such as Na, Si, V, and Cr are likely to be segregated in the crystal boundaries of the deposited Ag alloy film. Accordingly, it is possible that crystallinity of the Ag alloy film could be reduced due to oxidization of these elements under a hot-moisture condition; and the environmental resistance could be reduced.

Because of the reasons described above, among the inevitable impurities, the total content of Na, Si, V, and Cr is restricted to 100 ppm by mass or less in the Ag alloy sputtering target of the present embodiment.

In order to suppress the number of the abnormal electrical discharge further, it is preferable that, among the inevitable impurities, the total content of Na, Si, V, and Cr is set to 50 ppm by mass or less. More preferably, it is set to 10 ppm by mass or less.

[Method of Producing the Ag Alloy Sputtering Target]

Next, the method of producing the Ag alloy sputtering target, which relates to the present embodiment, is explained.

First, as melted raw materials, Ag having a purity of 99.9% by mass or more; and Cu, Sn, Sb, Mg, In, and Ti having a purity of 99.9% by mass or more are prepared. In addition, as metal elements having a standard electrode potential higher than Ag, Pd, Pt, and Au having a purity of 99.9% by mass or more are prepared. For S (sulfur), silver sulfide ($Ag_2S$) having a purity of 99.9% by mass or more is used.

In the case where, among the inevitable impurities, the total content of Y, Nd, Ni, Mo, W, Zn, Ga, Al, Fe, and Co; and/or the total content of Na, Si, V, and Cr are reduced, contents of these elements contained in the Ag raw materials are analyzed by ICP analysis or the like, and suitable materials are selected to be used. In order to reduce the total content of Y, Nd, Ni, Mo, W, Zn, Ga, Al, Fe, and Co; and/or the total content of Na, Si, V, and Cr, reliably among the inevitable impurities, it is preferable to perform electric smelting by using an electrolyte having a predetermined Ag concentration after leaching of Ag raw material with nitric acid, sulfuric acid, or the like.

Then, the selected Ag materials, additive elements (Cu, Sn, Sb, Mg, In, Ti, Pd, Pt, and Au), and silver sulfide are weighted to obtain a predetermined composition. Next, Ag is melted in high vacuum or inert gas atmosphere in a melting furnace; predetermined amounts of the additive elements and silver sulfide are added to the obtained melt. Then, by melting the content in the melting furnace in vacuum or inert gas atmosphere, the Ag alloy ingot, which has the composition including: one or more elements selected from Cu, Sn, Sb, Mg, In, and Ti in the range of 0.1 atomic % or more and 15.0 atomic % or less in total; S in the range of 0.5 atomic ppm or more and 200 atomic ppm or less; and a Ag balance including inevitable impurities, is produced. Similarly, the Ag alloy ingot, which has the composition including: one or more elements selected from Cu, Sn, Sb, Mg, In, and Ti in the range of 0.1 atomic % or more and 15.0 atomic % or less in total; one or more of metal elements having a standard electrode potential higher than Ag (Pd, Pt, and Au) at 0.1 atomic % or more in total, the grand total of the content of the metal elements and the total content of Cu, Sn, Sb, Mg, In, and Ti being 15.0 atomic % or less; S in the range of 0.5 atomic ppm or more and 200 atomic ppm or less; and a Ag balance including inevitable impurities, is produced.

By machine working after performing cold rolling and heat treatment to the obtained Ag alloy ingots, the Ag alloy sputtering targets relating to the present embodiment are produced. There is no limitation on the shape of the Ag alloy sputtering target, particularly, and it may be in a disk shape, a rectangular shape, and a cylindrical shape.

[Method of Producing the Ag Alloy Film]

In the method of producing the Ag alloy film of the present embodiment, the Ag alloy film is deposited by using the above-described Ag alloy sputtering target of present embodiment. There is no particular limitation on the film thickness of the Ag alloy film deposited by the method. In the case where the film is used as the transparent conductive film, it is preferable that the film thickness is in the range of 5 nm or more and 20 nm or less. In the case where the film is sued as the conductive film and the wiring film, it is preferable that the film thickness is in the range of 5 nm or more and 500 nm or less.

In addition, in the case where the film is used as the reflective film, it is preferable that the film thickness is in the range of 80 nm or more and 500 nm or less.

In the Ag alloy film, silver sulfide ($Ag_2S$) is formed as the coating film on the outermost surface. This silver sulfide film behaves as the protective film, and the ion migration resistance is improved.

In depositing the Ag alloy film by the method of producing the Ag alloy sputtering target, which relates to the present embodiment, it is preferable that it is done by the magnetron sputtering system. As an electricity power supply, any one of: the directly-current (DC) power supply; the high-frequency power supply; the medium-frequency power supply; and the alternate-current (AC) power supply, can be selected.

As the substrate of deposition, the glass plate or foil; the metal plate or foil; the resin plate or film; or the like can be used. In terms of the arrangement of the substrate during depositing, the static facing system; the in-line system; or the like can be used.

According to the Ag alloy sputtering target of the present embodiment configured as described above, agglomeration of films is suppressed due to the improved wettability; and heat-moisture resistance is improved in the deposited Ag alloy film, since the Ag alloy film includes: one or more elements selected from Cu, Sn, Sb, Mg, In, and Ti in the range of 0.1 atomic % or more and 15.0 atomic % or less in total. Specifically, reduction of optical and electric properties of the Ag alloy film can be suppressed in hot-moisture condition.

Furthermore, since the Ag alloy sputtering target of the present embodiment includes S in the range of 0.5 atomic ppm or more and 200 atomic ppm or less, the coating film of silver sulfide is formed on the outermost surface of the deposited Ag alloy film; and the ion migration resistance can be improved significantly. Therefore, it can be used for the miniaturized wiring and electrode patterns.

In addition, ionization of Ag is suppressed due to the increased standard electrode potential of the Ag alloy in the deposited Ag alloy film; and the ion migration resistance can be improved further, since the Ag alloy sputtering target includes the metal elements having a standard electrode potential higher than Ag in the range: from 0.1 atomic % or more in total; to 15.0 atomic % or less as the grand total of the content of the metal elements and the total content of Cu, Sn, Sb, Mg, In, and Ti, in the Ag alloy sputtering target of the present embodiment.

In addition, since the total content of Y, Nd, Ni, Mo, W, Zn, Ga, Al, Fe, and Co, each of which is an element forms sulfide with low free energy, is limited to 100 ppm by mass or less among the inevitable impurities in the Ag alloy sputtering target of the present embodiment, formation of sulfides of these elements can be suppressed. Accordingly, the ion migration resistance can be improved by forming the silver sulfide coating film on the outermost surface of the deposited Ag alloy film reliably. In addition, occurrence of abnormal electrical discharge and splashing can be suppressed during sputtering caused by the sulfides of the above-described elements; and deposition can be performed stably.

In addition, since the total content of Na, Si, V, and Cr, each of which is an element with low solid solubility against Ag, is limited to 100 ppm by mass or less among the inevitable impurities in the Ag sputtering target of the present embodiment, formation of oxides due to segregation of these elements in crystal boundaries can be suppressed; and occurrence of abnormal electrical discharge and splashing can be suppressed during sputtering.

In addition, even in the deposited Ag alloy film, segregation of these elements in crystal boundaries can be suppressed; and deterioration of environmental resistance of the Ag alloy film can be suppressed.

In the method of producing the Ag alloy film of the present embodiment, deposition is performed by using the above-described Ag alloy sputtering target of the present embodiment. Thus, the deposited Ag alloy film has excellent heat-moisture resistance; and optical and electric properties are stabilized even under a hot-moisture condition. In addition, occurrence of short-circuiting between wirings can be suppressed even if the miniaturized wiring patterns or electrode patterns are formed, since the Ag alloy film has a particularly excellent ion migration resistance.

In addition, since silver sulfide is used as the raw material for adding S in the present embodiment, S can be added in high yield; and the content of S can be controlled accurately.

In addition, since electric smelting is performed by using an electrolyte having a predetermined Ag concentration in the present embodiment after leaching of Ag raw material with nitric acid, sulfuric acid, or the like, the amount of impurities in the Ag raw material is reduced; and the Ag alloy sputtering target, in which the amount of the inevitable impurities is limited as described above, can be produced.

Embodiments of the present invention are explained above. However, the present invention is not particularly limited by the descriptions, and can be modified in the range not deviating from the scope of the present invention.

For example, in the present embodiment, it is explained that the deposited Ag alloy film is for usages as conductive films and wiring films of electronic device, such as touch panels, solar cells, organic EL elements, and the like. However, it is not limited by the description, and can be used for other purposes.

In addition, in terms of the film thickness of the Ag alloy film, it is not limited by the description of the embodiments, and can be modified depending on the intended use.

In addition, it is explained that the total content of Y, Nd, Ni, Mo, W, Zn, Ga, Al, Fe, and Co is limited to 100 ppm by mass or less; and the total content of Na, Si, V, and Cr is limited to 100 ppm by mass or less, among the inevitable impurities. However, the present invention is not particularly limited by the descriptions as long as the Ag ally sputtering target includes: one or more elements selected from Cu, Sn, Sb, Mg, In, and Ti in the range of 0.1 atomic % or more and 15.0 atomic % or less in total; and S in the range of 0.5 atomic ppm or more and 200 atomic ppm or less. In this case, there is no need to strictly perform the selection of the Ag materials.

EXAMPLES

Results of confirmatory experiments performed to confirm effectiveness of the present invention are explained below.

[Ag Alloy Sputtering Target]

First, as melted raw materials, Ag having a purity of 99.9% by mass or more; and Cu, Sn, Sb, Mg, In, and Ti having a purity of 99.9% by mass or more were prepared. In addition, as metal elements having a standard electrode potential higher than Ag, Pd, Pt, and Au having a purity of 99.9% by mass or more are prepared. In addition, silver sulfide ($Ag_2S$) having a purity of 99.9% by mass or more was prepared.

In order to reduce the content of the impurity elements, the method, in which electric smelting was performed by using an electrolyte having a predetermined Ag concentration after leaching of Ag raw material with nitric acid, sulfuric acid, or the like, was used. On the Ag materials with reduced impurities by this smelting method, impurity analysis by the ICP method was performed. The Ag materials, in which the total content of Y, Nd, Ti, Ni, Mo, W, Zn, Ga, Al, Fe, and Co was 100 ppm by mass or less; and the total content of Na, Si, V, and Cr was limited to 100 ppm by mass or less, were used as the raw materials for production of the sputtering target.

Then, the selected Ag materials; additive elements, Cu, Sn, Sb, Mg, In, Ti, Pd, Pt, and Au; and silver sulfide ($Ag_2S$) were weighted to obtain a predetermined composition. Next, Ag was melted in high vacuum or inert gas atmosphere; Cu, Sn, Sb, Mg, In, Ti, Pd, Pt, Au and silver sulfide ($Ag_2S$) were added to the obtained Ag melt; and they were melted in high vacuum or inert gas atmosphere. Then, by pouring the melt in the mold, the Ag alloy ingots were produced. Melting Ag was performed under the atmosphere substituted by Ag after the atmosphere was turned into vacuum ($5\times10^{-2}$ Pa or less) once. In addition, the addition of Cu, Sn, Sb, Mg, In, Ti, Pd, Pt, Au and silver sulfide ($Ag_2S$) was performed under Ar gas atmosphere.

In Examples 27-29 of the present invention, the Ag alloy sputtering targets were produced by using Ag raw materials, in which the above-described selection was not performed.

Next, after performing cold rolling to the obtained Ag alloy ingots at the rolling reduction rate of 70%, heat treatment, in which the retention time was 1 hour at 600° C. in the air, was performed. Then, by performing machine working, Ag alloy sputtering targets having the dimension of: 152.4 mm of the diameter; and 6 mm of the thickness, were produced. In the produced Ag alloy sputtering targets, the average grain size of silver was within the range of 20 µm or more and 200 µm or less. In addition, silver sulfide ($Ag_2S$) was dispersed in the targets.

[Composition Analysis]

Samples for analysis were collected from the Ag alloy ingots after casting; and these samples were analyzed by the ICP emission spectrometry.

[Number of Abnormal Electrical Discharge]

Target complexes were produced by soldering: the above-described Ag alloy sputtering targets of Examples of the present invention and Comparative Examples; to the backing plates made of oxygen-free copper by using indium solder.

The above-described target complexes were attached to the standard magnetron sputtering system; and sputtering was performed in the condition of: 0.5 Pa of Ar gas pressure; direct current 1000 W of the input power; and 60 mm of the distance between the target and the substrate, after exhausting to $1\times10^{-4}$ Pa. The number of abnormal electrical discharge during sputtering was measured by using the arc-counting function of the DC power supply (model: RPDG-50A) manufactured by MKS Instruments Co. as the number of abnormal electrical discharge from discharge initiation to after 1 hour.

[Ag Alloy Film]

After attaching the above-described Ag alloy sputtering targets of Examples of the present invention and Comparative Examples to the sputtering apparatus, the Ag alloy films were deposited in the condition described below.

Substrate: Cleaned glass substrate (Eagle XG manufacture by Corning Co.)
Vacuum level to be reached: $5\times10^{-5}$ Pa or less
Gas to be used: Ar
Gas pressure: 0.5 Pa
Sputtering electric power: Direct current 200 W
Distance between the target and the substrate: 70 mm
Film thickness: 100 nm

[Evaluation of Ion Migration]

The resist agent (OFPR-8600 manufactured by Tokyo Ohka Kogyo Co., Ltd.) was applied on the produced Ag alloy films by a spin coater, and exposed after pre-baking at 110° C. Then, patterns were developed by a developing solution (NMD-W manufactured by Tokyo Ohka Kogyo Co., Ltd.), and post-baking was performed at 150° C. By following the processes explained above, comb-shaped wiring patterns having the width of 100 µm and the gap of 100 µm were formed on the Ag alloy films. After that, etching was performed by using the etching solution (SEA-5 manufactured by Kanto Chemical Co., Inc.); and the resist was peeled by using the resist peeling agent (TOK-104 manufactured by Tokyo Ohka Kogyo Co., Ltd.). By following these processes, the Ag alloy films were processed into the above-described comb-shaped wiring pattern to obtain measurement samples.

Figure 1B:
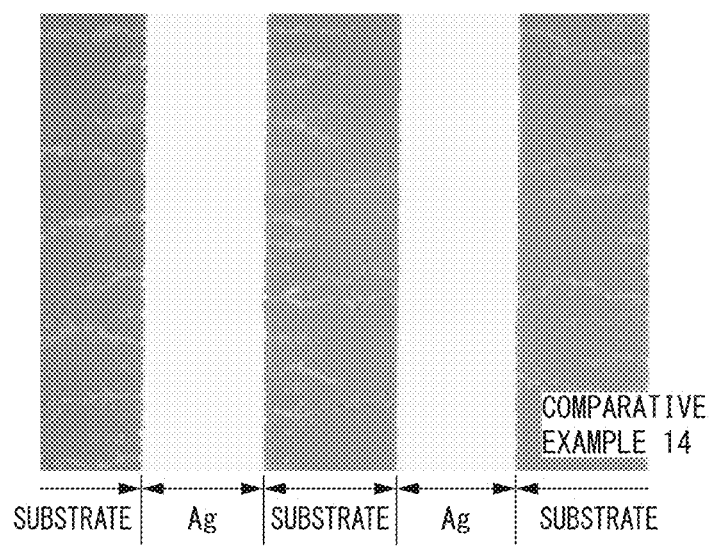
FIG. 1B is a figure showing an example of results of ion migration evaluation in one of Comparative Examples corresponding to Comparative Example 14. Regions corresponding to three substrates in the grey color; and regions corresponding to two Ag alloy films in the white color, are shown in the figure.

Next, the measurement samples were connected to the ion migration evaluation system (AMI-50-U) manufactured by ESPEC Co.; 100 hours-retention tests were performed under the condition of 85° C. of the temperature, 85% of humidity, and direct current 10V of the applied voltage; and the short-circuiting time was recorded based on the measurement of the insulation resistance value between wirings. In judging short-circuiting, the time when the resistance value between wirings became 1MΩ or less was regarded as the short-circuiting time. The evaluation results are shown in FIGS. 1A and 1B.

In addition, photographs of ion migration evaluation results in measurement samples of: Example 25 of the present invention; and Comparative Example 14, are shown in FIGS. 1A and 1B.

[Evaluation of Wiring Resistance]

Photo-lithography was performed on the obtained Ag alloy films by the same processes as ones described above; and the wiring patterns having 100 μm of the width and 200 μm of the length were formed to obtain wiring films.

The resistance values of the wiring films were measured by the four-terminal method with the Source Measure Unit 2400 (manufactured by KEITHLEY Co.).

The measurement of the resistance value was performed before and after the temperature and humidity controlled test in which samples were retained for 100 hours in a constant temperature and humidity chamber at 85° C. of the temperature and 85% of the humidity; and the rates of change were obtained. The evaluation results are shown in Tables 4 to 6. The lower the absolute value of the rate of change, the higher the stability of properties under hot-moisture condition; and the more excellent the heat-moisture resistance.

TABLE 1

|  |  | Composition of Ag alloy sputtering target |  |  |  |  |  |  |  |  |  |  | Impurities (mass ppm) | |
|---|---|---|---|---|---|---|---|---|---|---|---|---|---|---|
|  |  | Cu atomic % | Sn atomic % | Sb atomic % | Mg atomic % | In atomic % | Ti atomic % | S atomic % | Pd atomic % | Pt atomic % | Au atomic % | Ag | Total content of Y, Nd, Ti, Ni, Mo, W, Zn, Ga, Al, Fe, and Co | Total content of Na, Si, V, and Cr |
| Examples of the present invention | 1 | 0.13 | — | — | — | — | — | 3 | — | — | — | balance | 4 | 7 |
| | 2 | 4.30 | — | — | — | — | — | 4 | — | — | — | balance | 8 | 3 |
| | 3 | 14.80 | — | — | — | — | — | 7 | — | — | — | balance | 12 | 8 |
| | 4 | — | 0.12 | — | — | — | — | 8 | — | — | — | balance | 9 | 2 |
| | 5 | — | 5.00 | — | — | — | — | 4 | — | — | — | balance | 11 | 5 |
| | 6 | — | 14.90 | — | — | — | — | 6 | — | — | — | balance | 6 | 1 |
| | 7 | — | — | 0.12 | — | — | — | 5 | — | — | — | balance | 9 | 5 |
| | 8 | — | — | 4.50 | — | — | — | 1 | — | — | — | balance | 8 | 3 |
| | 9 | — | — | 14.80 | — | — | — | 3 | — | — | — | balance | 12 | 6 |
| | 10 | — | — | — | 0.13 | — | — | 10 | — | — | — | balance | 11 | 6 |
| | 11 | — | — | — | 5.20 | — | — | 7 | — | — | — | balance | 3 | 5 |
| | 12 | — | — | — | 14.90 | — | — | 4 | — | — | — | balance | 18 | 6 |
| | 13 | — | — | — | — | 0.11 | — | 2 | — | — | — | balance | 12 | 10 |
| | 14 | — | — | — | — | 4.50 | — | 4 | — | — | — | balance | 13 | 6 |
| | 15 | — | — | — | — | 14.70 | — | 5 | — | — | — | balance | 9 | 5 |
| | 16 | 4.20 | 0.55 | — | — | — | — | 6 | — | — | — | balance | 14 | 11 |
| | 17 | — | 2.10 | 2.30 | — | — | — | 4 | — | — | — | balance | 8 | 6 |

TABLE 2

|  |  | Composition of Ag alloy sputtering target |  |  |  |  |  |  |  |  |  |  | Impurities (mass ppm) | |
|---|---|---|---|---|---|---|---|---|---|---|---|---|---|---|
|  |  | Cu atomic % | Sn atomic % | Sb atomic % | Mg atomic % | In atomic % | Ti atomic % | S atomic % | Pd atomic % | Pt atomic % | Au atomic % | Ag | Total content of Y, Nd, Ti, Ni, Mo, W, Zn, Ga, Al, Fe, and Co | Total content of Na, Si, V, and Cr |
| Examples of the present invention | 18 | — | — | 2.10 | 1.00 | — | — | 2 | — | — | — | balance | 7 | 12 |
| | 19 | — | — | 3.00 | — | 0.53 | — | 6 | — | — | — | balance | 13 | 13 |
| | 20 | — | 1.50 | — | — | 3.10 | — | 7 | — | — | — | balance | 11 | 8 |
| | 21 | 2.30 | — | — | — | 0.57 | — | 1 | — | — | — | balance | 6 | 8 |
| | 22 | — | — | — | 0.05 | 0.07 | — | 2 | — | — | — | balance | 5 | 3 |
| | 23 | 7.40 | — | — | — | 7.30 | — | 2 | — | — | — | balance | 8 | 7 |
| | 24 | 1.50 | — | 0.53 | — | — | — | 24 | — | — | — | balance | 6 | 8 |
| | 25 | — | 2.80 | — | 0.54 | — | — | 50 | — | — | — | balance | 3 | 1 |
| | 26 | — | 1.90 | — | 0.11 | 2.00 | — | 178 | — | — | — | balance | 10 | 5 |
| | 27 | 3.60 | 0.53 | — | — | — | — | 5 | 0.14 | — | — | balance | 11 | 4 |
| | 28 | 3.70 | 0.54 | — | — | — | — | 6 | — | 0.13 | — | balance | 8 | 3 |
| | 29 | 3.80 | 0.51 | — | — | — | — | 4 | — | — | 0.12 | balance | 9 | 6 |
| | 30 | 3.70 | 0.49 | — | — | — | — | 6 | — | — | 4.50 | balance | 12 | 7 |
| | 31 | 3.70 | 0.51 | — | — | — | — | 3 | 6.00 | — | 4.50 | balance | 7 | 7 |
| | 32 | 4.00 | 0.51 | — | — | — | — | 5 | — | — | — | balance | 51 | 31 |

TABLE 2-continued

| | | Composition of Ag alloy sputtering target | | | | | | | | | | Impurities (mass ppm) | |
|---|---|---|---|---|---|---|---|---|---|---|---|---|---|
| | | Cu atomic % | Sn atomic % | Sb atomic % | Mg atomic % | In atomic % | Ti atomic % | S atomic % | Pd atomic % | Pt atomic % | Au atomic % | Ag | Total content of Y, Nd, Ti, Ni, Mo, W, Zn, Ga, Al, Fe, and Co | Total content of Na, Si, V, and Cr |
| | 33 | 3.80 | 0.55 | — | — | — | — | 5 | — | — | — | balance | 115 | 55 |
| | 34 | 3.90 | 0.49 | — | — | — | — | 4 | — | — | — | balance | 88 | 106 |

TABLE 3

| | | Composition of Ag alloy sputtering target | | | | | | | | | | Impurities (mass ppm) | |
|---|---|---|---|---|---|---|---|---|---|---|---|---|---|
| | | Cu atomic % | Sn atomic % | Sb atomic % | Mg atomic % | In atomic % | Ti atomic % | S atomic % | Pd atomic % | Pt atomic % | Au atomic % | Ag | Total content of Y, Nd, Ti, Ni, Mo, W, Zn, Ga, Al, Fe, and Co | Total content of Na, Si, V, and Cr |
| Comparative Examples | 1 | 0.03 | — | — | — | — | — | 3 | — | — | — | balance | 5 | 3 |
| | 2 | 19.30 | — | — | — | — | — | 4 | — | — | — | balance | 8 | 4 |
| | 3 | — | 0.01 | — | — | — | — | 6 | — | — | — | balance | 4 | 3 |
| | 4 | — | 18.70 | — | — | — | — | 11 | — | — | — | balance | 3 | 3 |
| | 5 | — | — | 0.02 | — | — | — | 8 | — | — | — | balance | 7 | 5 |
| | 6 | — | — | 19.90 | — | — | — | 6 | — | — | — | balance | 6 | 1 |
| | 7 | — | — | — | 0.04 | — | — | 10 | — | — | — | balance | 5 | 1 |
| | 8 | — | — | — | 18.60 | — | — | 5 | — | — | — | balance | 2 | 4 |
| | 9 | — | — | — | — | 0.02 | — | 3 | — | — | — | balance | 4 | 4 |
| | 10 | — | — | — | — | 16.70 | — | 1 | — | — | — | balance | 10 | 7 |
| | 11 | 0.01 | 0.01 | — | — | — | — | 5 | — | — | — | balance | 5 | 4 |
| | 12 | — | — | 10.30 | 8.90 | — | — | 2 | — | — | — | balance | 8 | 4 |
| | 13 | 3.70 | 0.45 | — | — | — | — | 3 | — | — | 14.4 | balance | 6 | 5 |
| | 14 | — | 0.50 | 0.52 | — | — | — | 0.03 | — | — | — | balance | 9 | 8 |
| | 15 | — | 1.00 | — | — | 2.10 | — | 251 | — | — | — | balance | 7 | 2 |

TABLE 4

| | | Composition of Ag alloy sputtering target | | | | | | | | | | Impurities (mass ppm) | |
|---|---|---|---|---|---|---|---|---|---|---|---|---|---|
| | | Cu atomic % | Sn atomic % | Sb atomic % | Mg atomic % | In atomic % | Ti atomic % | S atomic % | Pd atomic % | Pt atomic % | Au atomic % | Ag | Total content of Y, Nd, Ni, Mo, W, Zn, Ga, Al, Fe, and Co | Total content of Na, Si, V, and Cr |
| Examples of the present invention | 35 | — | — | — | — | — | 0.14 | 1 | — | — | — | balance | 8 | 2 |
| | 36 | — | — | — | — | — | 3.30 | 2 | — | — | — | balance | 2 | 4 |
| | 37 | — | — | — | — | — | 14.90 | 2 | — | — | — | balance | 4 | 3 |
| | 38 | 3.60 | — | — | — | — | 0.55 | 4 | — | — | — | balance | 4 | 2 |
| | 39 | 3.30 | — | — | — | — | 3.30 | 2 | — | — | — | balance | 5 | 1 |
| | 40 | 12.00 | — | — | — | — | 2.40 | 1 | — | — | — | balance | 2 | 1 |
| | 41 | — | 3.10 | — | — | — | 2.00 | 2 | — | — | — | balance | 4 | 3 |
| | 42 | 3.10 | — | — | — | — | 2.00 | 2 | — | — | 2.50 | balance | 4 | 1 |
| Comparative Example | 16 | — | — | — | — | — | 0.01 | 6 | — | — | — | balance | 2 | 2 |
| | 17 | — | — | — | — | — | 18.90 | 3 | — | — | — | balance | 1 | 2 |

TABLE 5

| | | Number of abnormal electrical discharge (times/h) | Ion migration evaluation Short-circuiting time (h) | Evaluation of wiring resistance Before temperature and humidity controlled test | Evaluation of wiring resistance After temperature and humidity controlled test | Rate of change |
|---|---|---|---|---|---|---|
| Example of the present invention | 1 | 0 | 54 | 3.7 | 4.4 | 19% |
| | 2 | 0 | 66 | 7.4 | 6.2 | −16% |
| | 3 | 0 | 90 | 14.5 | 11.5 | −21% |
| | 4 | 1 | 66 | 3.6 | 4.4 | 22% |
| | 5 | 0 | 72 | 8.3 | 7.7 | −7% |
| | 6 | 0 | 96 | 16.9 | 14.7 | −13% |
| | 7 | 1 | 54 | 3.5 | 4.0 | 14% |
| | 8 | 1 | 60 | 8.7 | 6.5 | −25% |
| | 9 | 0 | 96 | 17.6 | 13.0 | −26% |
| | 10 | 2 | 72 | 3.4 | 4.2 | 24% |
| | 11 | 1 | 54 | 7.0 | 6.3 | −10% |
| | 12 | 0 | 84 | 13.7 | 13.2 | −4% |
| | 13 | 0 | 42 | 3.4 | 4.2 | 24% |
| | 14 | 0 | 66 | 7.9 | 7.7 | −3% |
| | 15 | 0 | 84 | 15.4 | 12.9 | −16% |
| | 16 | 0 | 84 | 6.6 | 5.4 | −18% |
| | 17 | 0 | 72 | 7.6 | 6.1 | −20% |

TABLE 6

| | | Number of abnormal electrical discharge (times/h) | Ion migration evaluation Short-circuiting time (h) | Evaluation of wiring resistance Before temperature and humidity controlled test | Evaluation of wiring resistance After temperature and humidity controlled test | Rate of change |
|---|---|---|---|---|---|---|
| Example of the present invention | 18 | 0 | 60 | 5.9 | 4.3 | −27% |
| | 19 | 0 | 78 | 7.0 | 5.1 | −27% |
| | 20 | 0 | 66 | 8.2 | 7.4 | −10% |
| | 21 | 0 | 30 | 6.1 | 4.8 | −21% |
| | 22 | 1 | 36 | 3.4 | 4.1 | 21% |
| | 23 | 0 | 96 | 15.8 | 12.8 | −19% |
| | 24 | 2 | 96 | 5.9 | 4.7 | −20% |
| | 25 | 3 | >100 | 5.4 | 5.1 | −6% |
| | 26 | 15 | >100 | 9.3 | 8.2 | −12% |
| | 27 | 0 | >100 | 6.7 | 5.6 | −17% |
| | 28 | 0 | >100 | 6.8 | 5.5 | −19% |
| | 29 | 0 | >100 | 6.7 | 5.4 | −20% |
| | 30 | 0 | >100 | 12.4 | 9.7 | −22% |
| | 31 | 0 | >100 | 14.9 | 11.8 | −21% |
| | 32 | 4 | 36 | 7.3 | 5.8 | −21% |
| | 33 | 9 | 24 | 7.2 | 5.9 | −18% |
| | 34 | 15 | 24 | 7.3 | 6.0 | −18% |

TABLE 7

| | | Number of abnormal electrical discharge (times/h) | Ion migration evaluation Short-circuiting time (h) | Evaluation of wiring resistance Before temperature and humidity controlled test | Evaluation of wiring resistance After temperature and humidity controlled test | Rate of change |
|---|---|---|---|---|---|---|
| Comparative Example | 1 | 0 | 48 | 3.4 | 4.7 | 38% |
| | 2 | 0 | >100 | 21.0 | 16.2 | −23% |
| | 3 | 0 | 42 | 3.5 | 5.0 | 43% |
| | 4 | 0 | >100 | 20.9 | 17.8 | −15% |
| | 5 | 1 | 48 | 3.2 | 5.5 | 72% |
| | 6 | 0 | 96 | 23.7 | 16.1 | −32% |
| | 7 | 0 | 54 | 3.1 | 5.1 | 65% |
| | 8 | 0 | 84 | 19.9 | 15.5 | −22% |
| | 9 | 0 | 36 | 3.2 | 4.9 | 53% |
| | 10 | 0 | 84 | 19.0 | 17.5 | −8% |
| | 11 | 0 | 42 | 3.5 | 5.0 | 43% |
| | 12 | 0 | 90 | 21.6 | 15.8 | −27% |
| | 13 | 0 | >100 | 20.5 | 16.6 | −19% |
| | 14 | 0 | 6 | 3.2 | 4.0 | 25% |
| | 15 | 89 | >100 | 17.8 | 22.1 | 24% |

TABLE 8

| | | Number of abnormal electrical discharge (times/h) | Ion migration evaluation Short-circuiting time (h) | Evaluation of wiring resistance Before temperature and humidity controlled test | Evaluation of wiring resistance After temperature and humidity controlled test | Rate of change |
|---|---|---|---|---|---|---|
| Example of the present invention | 35 | 0 | 66 | 3.8 | 4.6 | 20% |
| | 36 | 0 | 96 | 7.5 | 7.7 | 2% |
| | 37 | 0 | >100 | 16.5 | 14.9 | −10% |
| | 38 | 0 | 96 | 7.8 | 6.7 | −14% |
| | 39 | 0 | >100 | 9.1 | 7.3 | −20% |
| | 40 | 0 | >100 | 15.4 | 13.6 | −12% |
| | 41 | 0 | 96 | 8.8 | 8.4 | −5% |
| | 42 | 0 | >100 | 9.9 | 9.8 | −1% |
| Comparative Example | 16 | 0 | 42 | 3.5 | 4.6 | 30% |
| | 17 | 0 | >100 | 25.6 | 20.5 | −20% |

In Comparative Examples 1, 3, 5, 7, 9, 11, and 16, in which the one or more elements selected from Cu, Sn, Sb, Mg, In, and Ti was less than 0.1 atomic % in total, the wiring resistance was changed significantly after the temperature and moisture controlled test; and heat-moisture resistance was insufficient.

In Comparative Examples 2, 4, 6, 8, 10, 12, and 17, in which the one or more elements selected from Cu, Sn, Sb, Mg, In, and Ti exceeded 15.0 atomic % in total, the wiring resistance of the Ag alloy film was too high; and the electrical property as the wiring film was insufficient.

In Comparative Example 13, in which the grand total of the content of the total content of Cu, Sn, Sb, Mg, In, and Ti; and the content of the metal elements having a standard electrode potential higher than Ag (Pd, Pt, and Au), exceeded 15.0 atomic %, the wiring resistance of the Ag alloy film was too high; and the electrical property as the wiring film was insufficient.

In Comparative Example 14, in which the content of S was less than 0.5 atomic ppm, the short-circuiting time was 6 hours and short in the ion migration evaluation. In addition, growing Ag between Ag alloy wirings was confirmed as shown in FIG. 1B.

In Comparative Example 15, in which the content of S exceeded 100 atomic ppm, the number of abnormal electrical discharge was 89-times; and sputtering was not performed stably.

Contrary to these, in Examples 1 to 42 of the present invention, which included the one or more elements selected from Cu, Sn, Sb, Mg, In, and Ti in the range of 0.1 atomic % or more and 15.0 atomic % or less in total and S in the range of 0.5 atomic ppm or more and 200 atomic ppm or less, the wiring resistance was low; the wiring resistance was not changed significantly even after the temperature and humidity controlled test; and the heat-moisture resistance was excellent. In addition, the short-circuiting time was sufficiently long in the ion migration evaluation; and the ion migration resistance was excellent. Particularly, in Example 25 of the present invention, growing of Ag between the wirings of Ag alloy was not confirmed as shown in FIG. 1A.

In addition, in Examples 27 to 31 and 42, which included the elements having a standard electrode potential higher than Ag (Pd, Pt, and Au), more excellent ion migration resistance was confirmed.

In Examples 32-34, which included high amounts of Y, Nd, Ti, Ni, Mo, W, Zn, Ga, Al, Fe, and Co; and Na, Si, V, and Cr among the inevitable impurities, it was confirmed that the ion migration resistance was slightly deteriorated.

Moreover, in Examples 16, 38, 39, and 41 of the present invention, which included the two or more elements selected from Cu, Ti, and Sn in the range of 1.0 atomic % or more and 10.0 atomic % or less in total, the wiring resistance was low; and the ion migration resistance was excellent.

Based on the results of the confirmatory experiments, it was confirmed that: the Ag alloy film, which had excellent heat-moisture resistance and ion migration resistance, could be deposited; and the Ag alloy sputtering target and the Ag alloy film, which made it possible to suppress occurrence of the abnormal electrical discharge, could be provided, according to the present invention.

INDUSTRIAL APPLICABILITY

According to the present invention, the Ag alloy film, which has more excellent environment resistance (heat-moisture resistance) and ion migration resistance, can be deposited. At the same time, improvement of quality and suppression of quality deterioration can be achieved in displays, LEDs, touch panels, and the like.

The invention claimed is:

1. An Ag alloy sputtering target having a composition consisting of:
one or more elements selected from Cu, Sn, Sb, Mg, In, and Ti in a range of 0.1 atomic % or more and 15.0 atomic % or less in total;
S in a range of 0.5 atomic ppm or more and 200 atomic ppm or less; and an Ag balance including inevitable impurities, wherein
S is dispersed in the Ag alloy sputtering target as silver sulfide ($Ag_2S$), at least one of Sn and In is essential in the composition of the Ag alloy sputtering target, and
at least one of Cu, Sb, Mg and Ti is essential in the composition of the Ag alloy sputtering target.

2. The Ag alloy sputtering target according to claim 1, wherein the Ag alloy sputtering target comprises two or more elements selected from Cu, Ti, and Sn in a range of 1.0 atomic % or more and 10.0 atomic % or less in total.

3. The Ag alloy sputtering target according to claim 1, wherein among the inevitable impurities, a total content of Y, Nd, Ni, Mo, W, Zn, Ga, Al, Fe, and Co is 100 ppm by mass or less.

4. The Ag alloy sputtering target according to claim 1, wherein among the inevitable impurities, a total content of Na, Si, V, and Cr is 100 ppm by mass or less.

5. A method of producing a Ag alloy film comprising a step of depositing a film by the Ag alloy sputtering target according to claim 1.

6. An Ag alloy sputtering target having a composition consisting of:
one or more elements selected from a group of Cu and Sn or a group of Ti and Sn in range of 0.1 atomic % or more and 15.0 atomic % or less in total;
S in a range of 0.5 atomic ppm or more and 200 atomic ppm or less; and an Ag balance including inevitable impurities, wherein
S is dispersed in the Ag alloy sputtering target as silver sulfide ($Ag_2S$), and Sn is essential in the composition of the Ag alloy sputtering target, and at least one of Cu, Sb, Mg and Ti is essential in the composition of the Ag alloy sputtering target.

7. An Ag alloy sputtering target having a composition consisting of:
one or more elements selected from Cu, Sn, Sb, Mg, In, and Ti in a range of 0.1 atomic % or more and 15.0 atomic % or less in total;
S in a range of 0.5 atomic ppm or more and 200 atomic ppm or less;
one or more of Pd, Pt and Au at 0.1 atomic % or more in total, a grand total of a content of the metal elements and a total content of Cu, Sn, Sb, Mg, In, and Ti being 15.0 atomic % or less; and
an Ag balance including inevitable impurities,
wherein S is dispersed in the Ag alloy sputtering target as silver sulfide ($Ag_2S$),
at least one of Sn and In is essential in the composition of the Ag alloy sputtering target, and
at least one of Cu, Sb, Mg and Ti is essential in the composition of the Ag alloy sputtering target.

* * * * *